United States Patent
Suzuki

(10) Patent No.: US 11,227,634 B1
(45) Date of Patent: Jan. 18, 2022

(54) DATA STORAGE DEVICE WITH COMPOSITE SPACER FOR DISK STACK ASSEMBLY

(71) Applicant: Western Digital Technologies, Inc., San Jose, CA (US)

(72) Inventor: Shoji Suzuki, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/915,962

(22) Filed: Jun. 29, 2020

(51) Int. Cl.
| G11B 17/028 | (2006.01) |
| G11B 17/038 | (2006.01) |
| G11B 19/20 | (2006.01) |
| G11B 25/04 | (2006.01) |
| G11B 33/14 | (2006.01) |

(Continued)

(52) U.S. Cl.
CPC .......... G11B 17/021 (2013.01); G11B 17/028 (2013.01); G11B 17/038 (2013.01); G11B 19/2009 (2013.01); G11B 19/2045 (2013.01); G11B 25/043 (2013.01); G11B 33/1433 (2013.01); G11B 33/0461 (2013.01); H05K 5/04 (2013.01); H05K 7/20163 (2013.01)

(58) Field of Classification Search
None
See application file for complete search history.

(56) References Cited

U.S. PATENT DOCUMENTS

| 4,911,968 A * | 3/1990 | Higasihara et al. ........................ G11B 7/24015 346/135.1 |
| 5,724,208 A | 3/1998 | Yahata |

(Continued)

FOREIGN PATENT DOCUMENTS

| JP | H06325454 A | 5/1993 |
| WO | 2019151459 A1 | 8/2019 |

OTHER PUBLICATIONS

Tseng, Chaw-Wu et al., "Vibration of Disk Drive Spindle Motors at Elevated Temperatures"; 29th Annual Symposium on Incremental Motion Control Systems & Devices; Jul. 17-20, 2000; http://pemclab.cn.nctu.edu.tw/W3lib/confers/IMCSD/Tseng.imcsd00.pdf; 10 pages.

(Continued)

Primary Examiner — Craig A. Renner
(74) Attorney, Agent, or Firm — Loza & Loza, LLP; Gabriel Fitch

(57) ABSTRACT

Aspects of the disclosure provide for mitigating a coefficient of thermal expansion (CTE) mismatch between glass components and adjacent metal components in a disk storage device to improve thermal and shock performance. The methods and apparatus provide a hub, provide a first recording disk comprising a glass material and a center hole on the hub such that the hub extends through the center hole of the first recording disk, provide a first spacer on the first recording disk, the first spacer comprising a nickel-iron alloy, and provide a second recording disk comprising a glass material and a center hole on the first spacer such that the hub extends through the center hole of the second recording disk, wherein the first recording disk and the second recording disk each comprise a magnetic recording layer configured to store information.

23 Claims, 6 Drawing Sheets

(51) Int. Cl.
    *G11B 17/02*     (2006.01)
    *H05K 5/04*     (2006.01)
    *H05K 7/20*     (2006.01)
    *G11B 33/04*     (2006.01)

(56) References Cited

U.S. PATENT DOCUMENTS

| | | |
|---|---|---|
| 6,130,801 A | 10/2000 | Cheng et al. |
| 6,160,686 A | 12/2000 | Albrecht et al. |
| 6,185,067 B1 | 2/2001 | Chamberlain |
| 6,785,090 B2 | 8/2004 | Koyanagi et al. |
| 7,782,731 B2 | 8/2010 | Henrichs |
| 9,466,327 B1 * | 10/2016 | Toffle .................. G11B 25/043 |
| 2003/0175471 A1 | 9/2003 | Kaneko |
| 2003/0223280 A1 * | 12/2003 | Okumura et al. ... G11B 17/038 |
| | | 365/199 |
| 2007/0014046 A1 | 1/2007 | Kim |

OTHER PUBLICATIONS

Ohara Corporation, "Glass-Ceramic Substrates for Hard Disk Media (TS-10)"; Accessed Apr. 2020; http://www.oharacorp.com/pdf/TS-10.pdf; 2 pages.

\* cited by examiner

PLAN VIEW

PROFILE VIEW

| Nickel-Iron Alloy | Nickel Percentage | CTE (μm/m-°C) | Density (g/cm³) |
|---|---|---|---|
| Alloy 36 | 36% | 1.5 | 8.11 |
| Alloy 42 | 42% | 5.3 | 8.11 |
| Alloy 48 | 48% | 8.5 | 8.2 |
| Alloy 52 | 52% | 10.3 | 8.3 |
| Alloy 54 | 54% | 10.3 | 8.3 |

DATA STORAGE DEVICE WITH COMPOSITE SPACER FOR DISK STACK ASSEMBLY

FIELD

The present disclosure relates generally to a structure of a data storage device, and more specifically, to methods and apparatus for mitigating a coefficient of thermal expansion (CTE) mismatch between glass components and adjacent metal components in the data storage device to improve thermal and shock performance.

INTRODUCTION

A hard disk drive (HDD) is an example of a data storage device (e.g., magnetic recording apparatus) where magnetic recording disks are used as recording media. The magnetic recording disks are rotated at a high speed in a recording apparatus, which may be used along with an information processing apparatus such as a computer. In the recording apparatus, multiple magnetic recording disks (hereinafter also referred to as a recording disk) are rotated at high speeds. Magnetic heads individually disposed on top and bottom faces of the recording disks write or read information on the disks.

A recording disk for a hard disk drive is rotated by a spindle motor assembly (rotary drive). Typically, the spindle motor assembly may include a spindle motor for rotating the recording disks, a spacer, a disk clamp, and one or more clamping screws. The spindle motor is installed at a base of the hard disk drive and includes a spindle shaft and a hub to secure the recording disks in place. The disk clamp is mounted at the top of the hub to stably support the recording disks on the hub. The spacer is ring-shaped and may be mounted between the recording disks. The spacer is disposed around the circumference of the hub of the spindle motor, and thus often takes a circular shape.

Glass disks may be used to achieve higher areal density in recording technology such as perpendicular magnetic recording (PMR). A Young's modulus of glass is higher than that of an aluminum-magnesium alloy, and therefore, allows a disk to be thinner while having a suitable rigidity. As such, glass may be more suitable for multi-platter drives where multiple disks (e.g., 10, 11, or 12 disks) can be installed into a drive without changing a typical drive height (e.g., approximately one inch).

To increase the areal density, the recording disks may be configured for heat assisted magnetic recording (HAMR). HAMR is a magnetic storage technology that can greatly increase the amount of data that can be stored on a magnetic device such as a recording disk by temporarily heating the magnetic or recording material during writing, which makes it much more receptive to magnetic effects and allows writing to much smaller regions (and much higher levels of data on a disk). Due to the relatively high heat involved with writing information in HAMR, new challenges are presented for the components of the data storage device including the recording disks.

SUMMARY

According to an aspect of the present disclosure, a data storage device is disclosed. The data storage device includes a hub and a plurality of stacked recording disks. Each recording disk includes a substrate including a glass material and a center hole, and a magnetic recording layer configured to store information, wherein the plurality of stacked recording disks are positioned on the hub via respective center holes. The data storage device further includes a plurality of spacers disposed between the plurality of stacked recording disks, each spacer comprising a nickel-iron alloy.

According to another aspect of the present disclosure, a method of a data storage device is disclosed. The method includes providing a hub, providing a first recording disk including a glass material and a center hole on the hub such that the hub extends through the center hole of the first recording disk, providing a first spacer on the first recording disk, the first spacer including a nickel-iron alloy, providing a second recording disk including a glass material and a center hole on the first spacer such that the hub extends through the center hole of the second recording disk, wherein the first recording disk and the second recording disk each comprise a magnetic recording layer configured to store information.

According to a further aspect of the present disclosure, a data storage device is disclosed. The data storage device includes a hub and a plurality of stacked recording disks. Each recording disk includes a substrate including a glass material and a center hole, and a magnetic recording layer configured to store information, wherein the plurality of stacked recording disks are positioned on the hub via respective center holes, and means for providing spacing between the plurality of stacked recording disks, the means comprising a nickel-iron alloy, wherein the glass material of the substrate has a first coefficient of thermal expansion (CTE), and wherein the nickel-iron alloy has a nickel composition that results in a second CTE for the nickel-iron alloy that matches the first CTE of the glass material within a preselected tolerance.

DETAILED DESCRIPTION

The present disclosure provides methods and apparatus for mitigating a coefficient of thermal expansion (CTE) mismatch between glass components and metal components in a data storage device to improve thermal and shock performance. In order mitigate CTE mismatch, a CTE of a glass material may be determined and a nickel-iron alloy may be selected based on the CTE of the glass material. Notably, the selected nickel-iron alloy has a nickel composition that results in a CTE for the nickel-iron alloy that matches the CTE of the glass material. Thereafter, a plurality of recording disks may be stacked, wherein each recording disk is made of the glass material, and a plurality of spacers may be disposed between the plurality of stacked recording disks, wherein each spacer is made of the nickel-iron alloy. By mitigating the CTE mismatch between the glass material and the nickel-iron alloy, movement of (or force exerted on) a recording disk is reduced during thermal expansion or a shock event, and therefore, read/write performance may be improved.

Figure 1A:
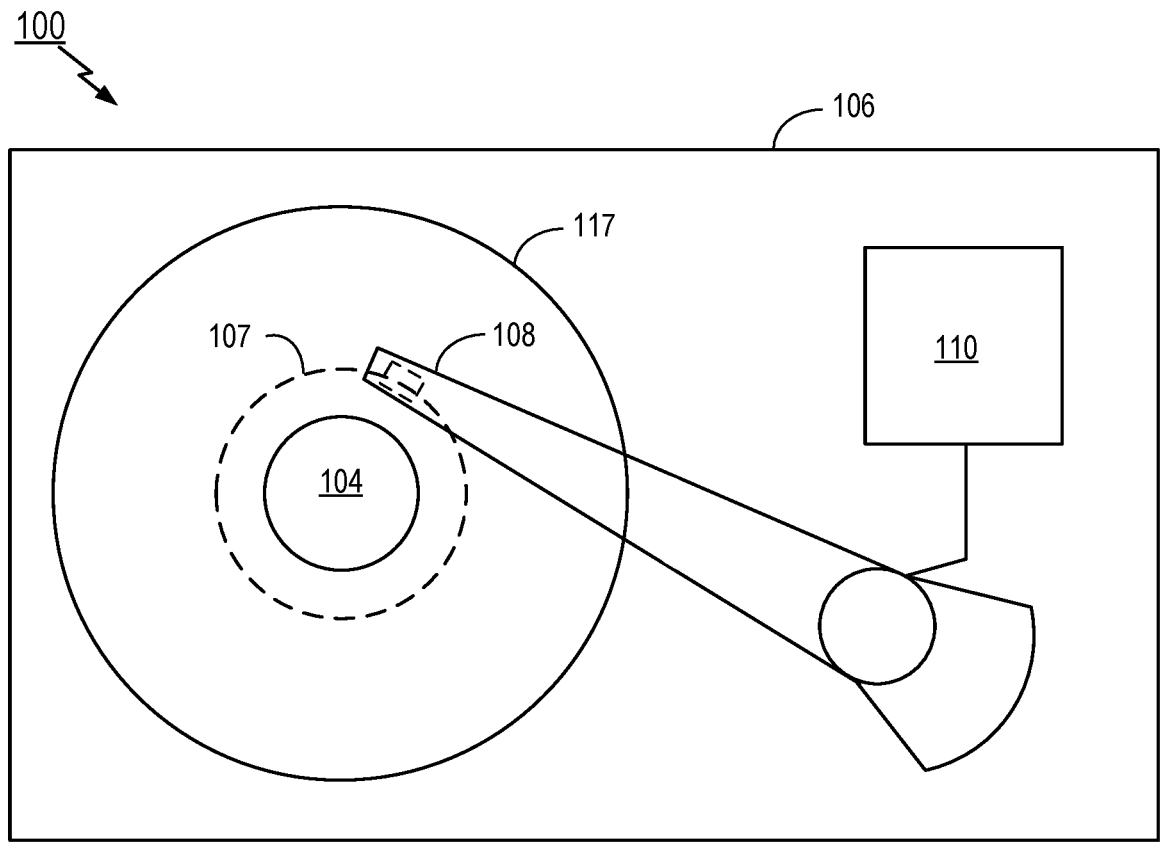
FIG. 1A illustrates a plan view of a data storage device (e.g., disk drive) configured for heat assisted magnetic recording (HAMR) in accordance with aspects of the present disclosure.

FIG. 1A illustrates a plan view of a data storage device (e.g., disk drive) 100 configured for heat assisted magnetic recording (HAMR). The disk drive 100 may be a type of a magnetic storage device or magnetic recording apparatus. The disk drive 100 includes one or more media 117 (e.g., recording disk or substrate), a spindle assembly 104 (which may include a spindle shaft 118 and a spindle motor 125), a drive housing 106, a slider 108 and a circuitry 110. The slider 108 may include a slider head. The slider 108 may be used to position the slider head. The media 117 may be configured to store data. The media 117 may be a heat assisted magnetic recording (HAMR) medium. The media 117 may be media or recording disk. The media 117 may be a means for storing data. The media 117 is positioned on the spindle assembly 104 that is mounted to the drive housing 106. Data may be stored along tracks along the magnetic recording layer of the media 117. The reading and writing of data are accomplished with a read element and a write element located within the slider 108. The write element is used to alter the properties of the magnetic recording layer of the media 117 and thereby write information thereto. In an implementation, the slider head of the slider 108 may have magneto-resistive (MR), giant magneto-resistive (GMR), or tunnel magneto-resistive (TMR) elements. In another implementation, the slider 108 may include a Hall effect head.

During an operation of the disk drive 100, a spindle motor (e.g., spindle motor 125 in FIG. 2) rotates the spindle assembly 104, and thereby rotates the media 117. The slider 108 may be positioned over the media 117 at a particular location along a desired disk track 107. The positions of the slider 108, relative to the media 117 may be controlled by a position control circuitry 110. As the media 117 is rotating, the slider 108 may glide over the media 117.

Figure 1B:
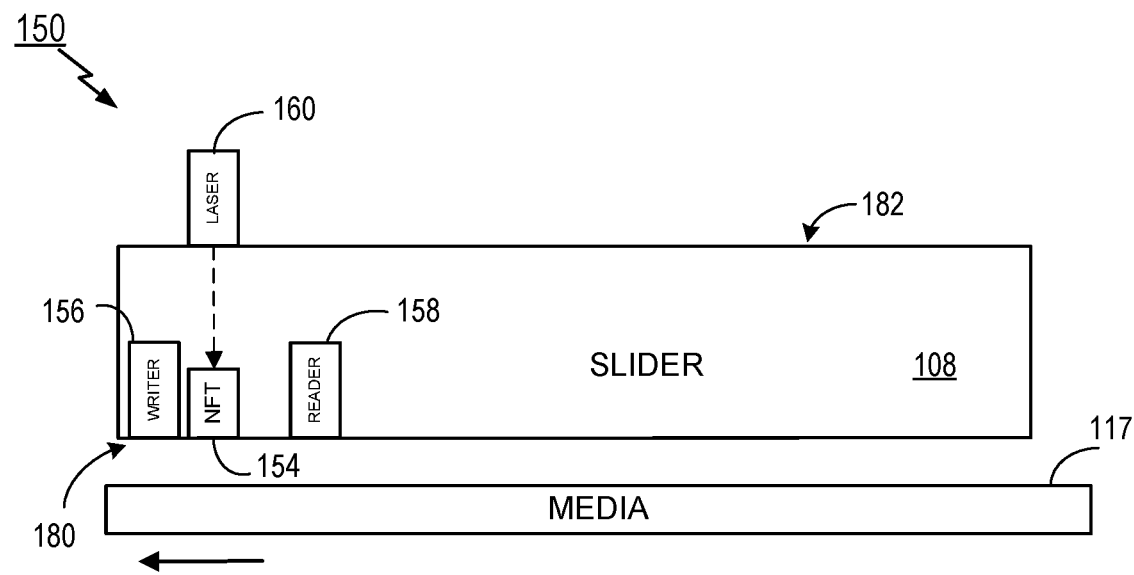
FIG. 1B illustrates a profile view of the slider and the media of FIG. 1A in accordance with aspects of the present disclosure.

FIG. 1B illustrates a profile view of the slider 108 and the media 117 of FIG. 1A. In particular, FIG. 1B illustrates an assembly 150 that includes the slider 108, a near-field transducer (NFT) 154, a writer 156, a reader 158, and a laser 160. The NFT 154 and laser 160 may be omitted in a non-HAMR head, and other components may be used instead in other types of energy assisted recording technology (e.g., a spin torque oscillator (STO) in a microwave assisted magnetic recording (MAMR) head). The slider 108 is positioned over the media 117. The slider 108 may be one component or several components. The slider 108 may include a slider head and a slider head. In some implementations, a slider head may be a separate component that may be integrated with the slider 108. The NFT 154, the writer 156, and the reader 158 may be implemented in the slider, the slider head or combinations thereof.

The slider 108 includes a first surface 180 (e.g., bottom surface) that faces the media 117. The first surface 180 may be referred to as an air bearing surface (ABS). The slider 108 also includes a second surface 182 (e.g., top surface) that faces away from the media 117. The NFT 154, the writer 156, and the reader 158 may be located near or along the first surface 180 of the slider 108. The writer 156 may be a writing element (e.g., means for writing data) for writing data on the media 117, and the reader 158 may be a reading element (e.g., means for reading data) for reading data on the media 117. The writer 156 may include a writing pole/writer pole. The laser 160 may be located on the top surface 182.

In operation, the laser 160 is configured to generate and direct light energy to a waveguide (possibly along the dashed line) in the slider which directs the light to the NFT 154 near the ABS 180. Upon receiving the light from the laser 160 via the waveguide, the NFT 154 generates localized heat energy that heats a portion of the media 117 near the write element 156 to facilitate writing information to the media 117. The media 117 may be made of a glass substrate configured to withstand the relatively high temperatures associated with writing to the media using HAMR (e.g., localized heating via the laser 160 and NFT 154). In particular, glass may be used in HAMR applications because of its ability to withstand high deposition temperatures during a media sputtering process. The high deposition temperatures may reach near 700° C. At such temperatures, a conventional Al—Mg substrate with a NiP-plated layer may not be able to maintain mechanical integrity. Although a writing temperature for HAMR is also very high, localized heat dissipates within thin sputtered layers. As such, the use of glass substrates may primarily be motivated by the high heat associated with media fabrication processes such as deposition and sputtering in particular.

Figure 2:
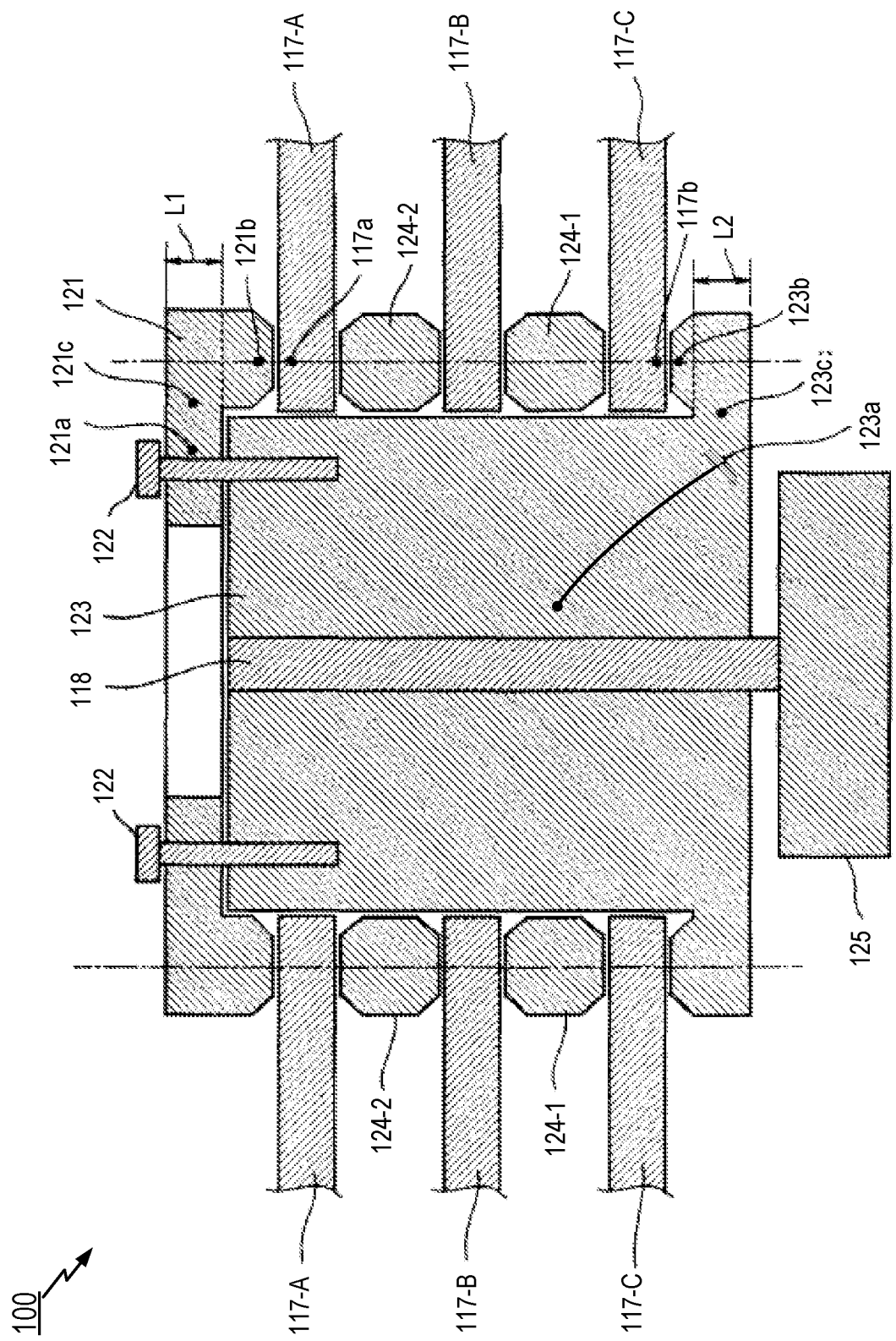
FIG. 2 is a cross-sectional view showing sub-components of a data storage device including multiple recording disks (e.g., made of glass substrate) in accordance with an aspect of the present disclosure.

FIG. 2 is a cross-sectional view showing sub-components of a data storage device including multiple recording disks (e.g., each including a glass substrate) in accordance with an aspect of the present disclosure. The media (recording disks) include three recording disks 117-A, 117-B, and 117-C, collectively referred to as recording disks 117, with magnetic recording layers provided adjacent their respective top and bottom surfaces. The recording disks 117 are stacked and secured to a hub 123, which is coupled to a spindle shaft 118. In an aspect, the top and bottom surfaces of each disk of the recording disks 117 may individually be used as information recording surfaces, and an individual magnetic head on a slider (not shown in FIG. 2 but see slider 108 in FIGS. 1A and 1B) is used for each surface. Moreover, each recording disk 117 may include a heat sink layer. Individual disks are rotated together with the hub 123 and spindle shaft 118, which may be rotated by a spindle motor 125. In the following descriptions, for ease of explanation, the spindle motor 125 is described as a rotational shaft type that rotates the spindle shaft 118 according to some aspects, however, a stationary shaft type that does not rotate the spindle shaft 118 may also be used in other aspects.

The hub 123 may have a cylindrical shape/portion 123a. The recording disks 117 may each have a central hole or central opening configured to fit on the cylindrical portion 123a of the hub 123. The hub 123 also includes a perimetric portion 123b and a connecting portion 123c that extends outwardly from the cylindrical portion 123a. The perimetric portion 123b supports the lowermost recording disk 117-C. A first ring-shaped spacer 124-1 is disposed on top of recording disk 117-C. Recording disk 117-B is on top of first ring-shaped spacer 124-1, and a second-ring shaped spacer 124-2 is disposed on top of recording disk 117-B. Recording disk 117-A is on top of second-ring shaped spacer 124-2. In FIG. 2, the assembly 100 includes three recording disks 117 and two spacers. In other aspects, the assembly 100 (e.g., data storage device) may have more than or less than three recording disks, and more than or less than two spacers.

The recording disks 117 may be secured to the hub 123 by a top clamp 121 placed at the top of the hub 123, and therefore, may secure recording disk 117-A, with a downward force opposing the upward force/support provided by the perimetric portion 123b of the hub 123, from an upper portion of the data storage device 100. The top clamp 121 and the hub 123 may be secured together using one or more screws 122, which may also secure the recording disks 117 to the spindle shaft 118. For example, if six screws 122 are used, then the screws 122 may be disposed at intervals of 60 degrees, dividing the angle of 360 degrees of the circumference of a recording disk 117 into six parts.

In some aspects, the hub 123 may be made of stainless steel. However, the hub 123 may also be made of aluminum or an aluminum alloy according to some other aspects. In an aspect, the top clamp 121 may be made of stainless steel, for example. Notably, stainless steel is a material that has stable chemical properties over an entire expected temperature range in which a data storage device or magnetic recording apparatus (e.g., hard disk drive) may be used. Moreover, stainless steel has a coefficient of elasticity to withstand a clamping force required to clamp the recording disks 117-A to 117-C while the data storage device is in use. The clamping force may be obtained from a tightening force used to tighten the screws 122 that presses on a clamp portion 117a of disk 117-A and a clamp portion 117b of disk 117-C, in part from the perimetric portion 123b, and thereby secure the disks 117 to the hub 123 at upper and lower portions of the data storage device. The hub 123 is secured to the spindle shaft 118, which is the axis of rotation of the spindle motor 125. The top clamp 121 is secured by tightening the screws 122 into the hub 123. As shown in FIG. 2 and described above, the ring-shaped spacers 124-1 and 124-2, collectively referred to as 124, (e.g., made of a ceramic material, composite material, polymer, and/or metal alloy) are inserted in the spaces among the three recording disks 117-A, 117-B, and 117-C. A coefficient of thermal expansion (CTE) of the spacers 124 may be close to (or match) the CTE of the glass substrate. This matching or minimal mis-matching will be described in greater detail below.

A radius of the cylindrical portion 123a of the hub 123 that goes through center holes of the recording disks 117-A, 117-B, and 117-C may be smaller than a radius of a perimetric portion 123b which holds the recording disk 117-C from the lower portion of the data storage device 100. Likewise, a radius at which screwing positions 121a are disposed in the top clamp 121 may be smaller than a radius of a perimetric portion 121b which holds the recording disk 117-A from the upper portion of the data storage device 100. The screwing positions 121a and the perimetric portion 121b of the top clamp 121 may be integrally formed in a stainless steel member (e.g., top clamp 121), and the thickness of a connecting portion 121c may be L1. The cylindrical portion 123a and the perimetric portion 123b of the hub 123 may also be integrally formed in a stainless steel member, and the thickness of a connecting portion 123c may be L2.

In Heat Assisted Magnetic Recording (HAMR) applications, very high temperatures (near 700° C.) may be used for writing information to the media and for fabricating HAMR media (e.g., high temperatures may be used during deposition of certain layers or materials on the media substrate). Thus, a substrate of the recording disk (hereinafter also referred to as "media") may be made of a glass material, particularly a glass material with a high transition temperature, and suitable for use in a HAMR application. Notably, a glass transition temperature ($T_g$) may be defined as a temperature at which a rate of heat capacity changes. The $T_g$ is close to an annealing temperature at which strain in a glass material can be removed. A temperature at which the glass becomes too soft and cannot maintain its physical shape (softening point) is higher than the $T_g$. Glass having a $T_g$ that is higher than a sputtering temperature of HAMR media is preferred. In some aspects, the $T_g$ and a coefficient of thermal expansion (CTE) of the glass can be modified by adjusting the compositions of glass material. However, higher $T_g$ may result in lower CTE most of the time. Thus, glass with low CTE may be used in various HAMR applications because of the higher deposition temperatures (leading to higher $T_g$) associated with HAMR.

The various components of the disk drive (or hard disk drive (HDD)) may be made of different materials. For example, the substrate of the recording disk may be made of the glass material while the spacer, the hub, and the disk clamp may be made of a metal (e.g., stainless steel). Accordingly, because the recording disk (and the substrate may be the primary structural component of the recording disk), the hub, the spacer, and the disk clamp contact each other, a difference in CTE causes an amount of thermal expansion therebetween due to temperature variance. The difference (mismatch) in CTE generates stress at the interface of two materials, and therefore, can shift positions of the components (recording disk, hub, spacer, and disk clamp) and affect drive performance such as servo tracking.

Materials used for HAMR disk substrates can have low CTE for applications with high areal density. However, if the CTE of the disk substrate material is much lower than the CTE of adjacent and/or contacting metal components (e.g., hub, spacer, etc.) within the HDD, then a mismatch of heat expansion rates is present. To avoid the mismatch of heat expansion rates, the CTE of the disk substrate material should be close in value to (or match) the CTE of the metal components. For example, if glass is used as the disk substrate material, then a particular metal (e.g., stainless steel) having a low CTE should be used as the material for other components (e.g., hub, spacer, etc.) within the HDD. Stainless steel typically has a CTE of $10.0 \times 10^{-6}$ (° C.)$^{-1}$ (or 10.0 μm/m-° C.) in the HDD while glass may have a CTE of $3.0 \times 10^{-6}$ (° C.)$^{-1}$ to $5.0 \times 10^{-6}$ (° C.)$^{-1}$ (or 3.0 μm/m-° C. to 5.0 μm/m-° C.). In comparison, glass used for Perpendicular Magnetic Recording (PMR) has a CTE of approximately $8.3 \times 10^{-6}$ (° C.)$^{-1}$ (or ~8.3 μm/m-° C.). A multi-platter PMR-HDD may use glass typically used in HAMR applications because of the glass's high Young's modulus.

As HAMR applications continue to evolve, the CTE of the glass used may become smaller, and therefore, the difference in CTE between the metal components and the glass substrates within the HDD may become larger. A large CTE mismatch between the metal components and the glass substrates may be problematic when the HDD experiences heat variation causing the components within the HDD to expand or shrink at different rates when experiencing the same applied heat. The large CTE mismatch may produce a sliding motion or exert some force on the glass substrate or metal components. Such sliding motion or force may cause distortion and consequently cause movement of a servo track signal, which degrades read and write performance of the HDD. Accordingly, aspects of the present disclosure are directed to mitigating the difference in CTE between the metal components and the glass substrate to improve thermal and shock performance in the HDD.

In an aspect, to match a low CTE of the glass substrate (glass media), a spacer (metal component) used in conjunction with the glass substrate in the HDD may be made of a nickel-iron alloy. For example, the nickel-iron alloy may be Invar, but other nickel-iron alloys having compositions of nickel and iron different from Invar may also be used. In an aspect, the compositions of nickel and iron may be varied in the nickel-iron alloy, or pre-selected, to attain a desired CTE for the alloy. Accordingly, the CTE of the nickel-iron alloy used in the HDD may be matched to the CTE of the glass substrate. For example, if the CTE of the glass substrate used in the HDD (e.g., for a HAMR application) is approximately $3.0 \times 10^{-6}$ (° C.)$^{-1}$ to $4.0 \times 10^{-6}$ (° C.)$^{-1}$, then a spacer used in the HDD may be made of a nickel-iron alloy (Invar) having a similar CTE (e.g., within a preselected tolerance) in order to mitigate CTE mismatch between the glass substrate and the spacer. In one aspect, the preselected tolerance can be 20 percent or about 20 percent.

Figure 3:
FIG. 3 illustrates a table depicting an example relationship between nickel composition and a coefficient of thermal expansion (CTE) for a variety of nickel-iron alloys.

FIG. 3 illustrates a table 300 depicting an example relationship between nickel composition and CTE for a variety of nickel-iron alloys. For each nickel-iron alloy identified (e.g., Alloy 36, Alloy 42, Alloy 48, Alloy 52, and Alloy 54), a corresponding nickel percentage, mean coefficient of thermal expansion (CTE) in an annealed condition for a temperature range of 20 to 100° C., and density are provided.

In an aspect, the CTE of an example glass substrate used in a HDD (e.g., for a HAMR application) may be within a range of approximately $3.0 \times 10^{-6}$ (° C.)$^{-1}$ to $5.1 \times 10^{-6}$ (° C.)$^{-1}$ (e.g., $3.5 \times 10^{-6}$ (° C.)$^{-1}$, $3.9 \times 10^{-6}$ (° C.)$^{-1}$, or $5.1 \times 10^{-6}$ (° C.)$^{-1}$). As shown in table 300, the Alloy 36 having a nickel composition of 36% (percent by weight) has a CTE of $1.5 \times 10^{-6}$ (° C.)$^{-1}$. Moreover, the Alloy 42 having a nickel composition of 42% (percent by weight) has a CTE of $5.3 \times 10^{-6}$ (° C.)$^{-1}$. Thus, based on this information, a nickel-iron alloy having a nickel composition of greater than 36% and less than 42% (therefore resulting in a CTE of greater than $1.5 \times 10^{-6}$ (° C.)$^{-1}$ and less than $5.3 \times 10^{-6}$ (° C.)$^{-1}$) may be used as a metal component (e.g., spacer) in the HDD to better match the CTE of the glass substrate (approximately $3.0 \times 10^{-6}$ (° C.)$^{-1}$ to $5.1 \times 10^{-6}$ (° C.)$^{-1}$). In an aspect, the nickel-iron alloy to be used with the glass substrate in the HDD (e.g., for a HAMR application) may have a CTE of approximately $3.5 \times 10^{-6}$ (° C.)$^{-1}$ to $5.1 \times 10^{-6}$ (° C.)$^{-1}$.

In an aspect, an acceptable range between the CTE of a glass substrate and the CTE of an adjacent metal component in the HDD may depend on whether the glass substrate has a low track density or a high track density. For the glass substrate with the low track density, a larger CTE mismatch between the glass substrate and the metal component may be acceptable because the track width is wider and the number of tracks within a certain area is smaller. For example, if the CTE of the glass substrate having the low track density is $5.0 \times 10^{-6}$ (° C.)$^{-1}$, then a metal component (spacer) having a CTE of up to $10.0 \times 10^{-6}$ (° C.)$^{-1}$ may be acceptable for use with the glass substrate. However, for the glass substrate with high track density, the CTE mismatch between the glass substrate and the metal component may be smaller. In a high track density glass substrate, the track width is narrower and the number tracks within a certain area is higher, and therefore, small deviations in a track or partition may cause read and write errors. As track density increases, accuracy may be improved by mitigating the CTE mismatch between the glass substrate and the adjacent metal components using the techniques described herein.

Figure 4:
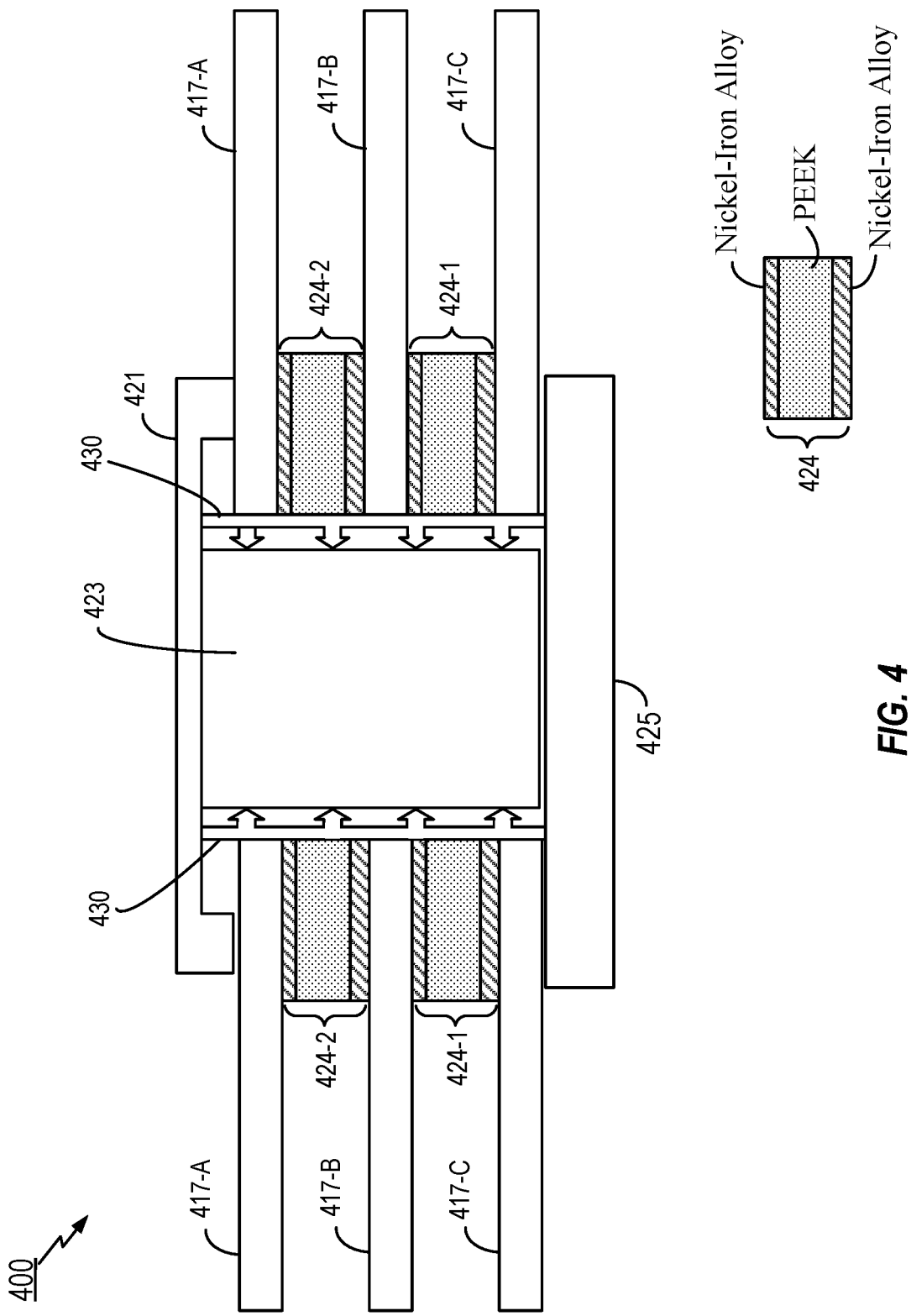
FIG. 4 is a cross-sectional view of an example data storage device in accordance with another aspect of the present disclosure.

FIG. 4 is a cross-sectional view of an example data storage device 400 (e.g., hard disk drive (HDD)) in accordance with another aspect of the present disclosure. The disk storage device 400 shown in FIG. 4 may operate in a manner similar to the data storage device 100 described above. The data storage device, or magnetic recording apparatus, 400 includes three stacked recording disks 417-A, 417-B, 417-C (collectively referred to as recording disks 417) with magnetic recording layers for storing information provided on their top and bottom surfaces. In one aspect, information is only stored on either the top or bottom surface. Each recording disk 417 may include a heat sink layer, or one per recording surface. Moreover, individual disks are rotated together by a hub 423, which may be rotated by a spindle motor 425.

The hub 423 may have a cylindrical shape/portion and secures the recording disks 417 in place (e.g., secures the disks 417 to a spindle shaft (not shown) rotatably connected to the spindle motor 425). The recording disks 417 may each have a central hole or central opening configured to fit on the cylindrical portion of the hub 423. The recording disks 417 may be secured to the hub 423 by a top clamp 421 placed at the top of the hub 423. A top surface and a bottom surface of each disk of the recording disks 417 may be individually used as information recording surfaces, and an individual magnetic head (not shown) is used for each surface.

In an aspect, the data storage device 400 may include one or more recording disks (e.g., three recording disks 417) made of a glass substrate (e.g., that is suitable for HAMR applications). In an aspect, the hub 423 may be made of stainless steel. However, the hub 423 may also be made of aluminum or an aluminum alloy according to some other aspects. As stated above, stainless steel is a material that has stable chemical properties over an entire expected temperature range in which a data storage device (e.g., hard disk drive) may be used. Moreover, stainless steel has a coefficient of elasticity to withstand a clamping force required to clamp the recording disks 417 while the data storage device 400 is in use. In an aspect, the data storage device 400 may include a tolerance ring 430 for absorbing radial expansion of the hub 423 (e.g., if the hub 423 is made of aluminum or an aluminum alloy).

Ring-shaped spacers 424-1 and 424-2, collectively referred to as spacers 424 (e.g., made of a polymer and/or metal alloy) are inserted in the spaces between the three recording disks 417. A first ring-shaped spacer 424-1 is disposed on top of recording disk 417-C. Recording disk 417-B is on top of first ring-shaped spacer 424-1, and a second-ring shaped spacer 424-2 is disposed on top of recording disk 417-B. Recording disk 417-A is on top of second ring shaped spacer 424-2. In FIG. 4, the data storage device 400 includes three recording disks 417 and two spacers. In other aspects, the data storage device 400 may have more than or less than three recording disks, and more than or less than two spacers. A CTE of the spacers 424 may be close in value to (or match) that of the glass substrate. In an aspect, a spacer 424 may be made entirely of a nickel-iron alloy having a CTE that matches the CTE of a glass substrate (recording disk 417). For example, if the CTE of the glass recording disk 417 is within the range of approximately $3.0 \times 10^{-6}$ (° C.)$^{-1}$ to $5.1 \times 10^{-6}$ (° C.)$^{-1}$, then the spacer 424 may be made of a nickel-iron alloy having a nickel composition of greater than 36% and less than 42% by weight (therefore resulting in a CTE of greater than $1.5 \times 10^{-6}$ (° C.)$^{-1}$ and less than $5.3 \times 10^{-6}$ (° C.)$^{-1}$) to better match the CTE of the recording disk 417.

In another aspect, the spacer 424 may be made of the nickel-iron alloy and a polymer. For example, as shown in FIG. 4, the spacer 424 may include three layers (as shown by the different patterns inside spacer 424), wherein a top layer and a bottom layer are made of the nickel-iron alloy as described above, and a middle layer is made of carbon-doped polyether-ether-ketone (PEEK). As such, use of the spacer 424 made of a combination of the nickel-iron alloy and the polymer not only mitigates a CTE mismatch between the spacer 424 and the recording disk 417 but may also allow the hub 423 to be made of aluminum or an aluminum alloy instead of stainless steel. Notably, because aluminum is lighter than stainless steel, an aluminum hub will reduce an overall weight of the data storage device 400. Notably, PEEK has a much higher CTE compared to a CTE of the nickel-iron alloy or aluminum. Therefore, the spacer 424 made of a combination of the nickel-iron alloy and PEEK can match a thermal expansion of aluminum (used for the hub) in an axial direction (e.g., of the disk). In a radial direction, the nickel-iron, which directly interfaces with the glass disk/substrate, can mitigate and contain relative motion even when a PEEK material moves (e.g., expands or shrinks). PEEK also performs well in disk drive applications with respect to outgassing and contamination.

In an aspect, the weight of the data storage device (HDD) may be a factor to consider. When the HDD is exposed to a certain shock conditions (e.g., G-forces applied to the HDD), the HDD (e.g., motor hub assembly) may vibrate causing certain components within the HDD to contact each other, leading to a deformation of a recording disk and a deterioration of data reading/writing performance. A large contributor to disk deformation is the deformation of a base plate in the HDD. The base plate supports a disk hub assembly. Therefore, if the disk hub assembly has significant weight, then more force is exerted onto the base plate when the HDD is exposed to a shock condition causing the base plate to experience deformation. However, if the disk hub assembly is designed to have a lighter weight, then less force is exerted onto the base plate during the shock condition, and therefore, the base plate experiences less deformation. As such, aspects of the disclosure are also directed to minimizing a weight of the components in the HDD, such as the recording disk, the spacer, and the hub (as described with respect to FIG. 4 above) to avoid movement of the components during a shock event.

The spacers 424 in FIG. 4 have a rectangular shaped cross section. The spacers 124 in FIG. 2 have an octagonal shaped cross section. In one aspect, the spacers can have other suitable shapes with different cross sections. For example, in one aspect, the top and bottom surfaces of the spacer can be flat while the innermost and/or outermost edges, in a radial direction, can be rounded or be flat with rounded corners.

Figure 5:
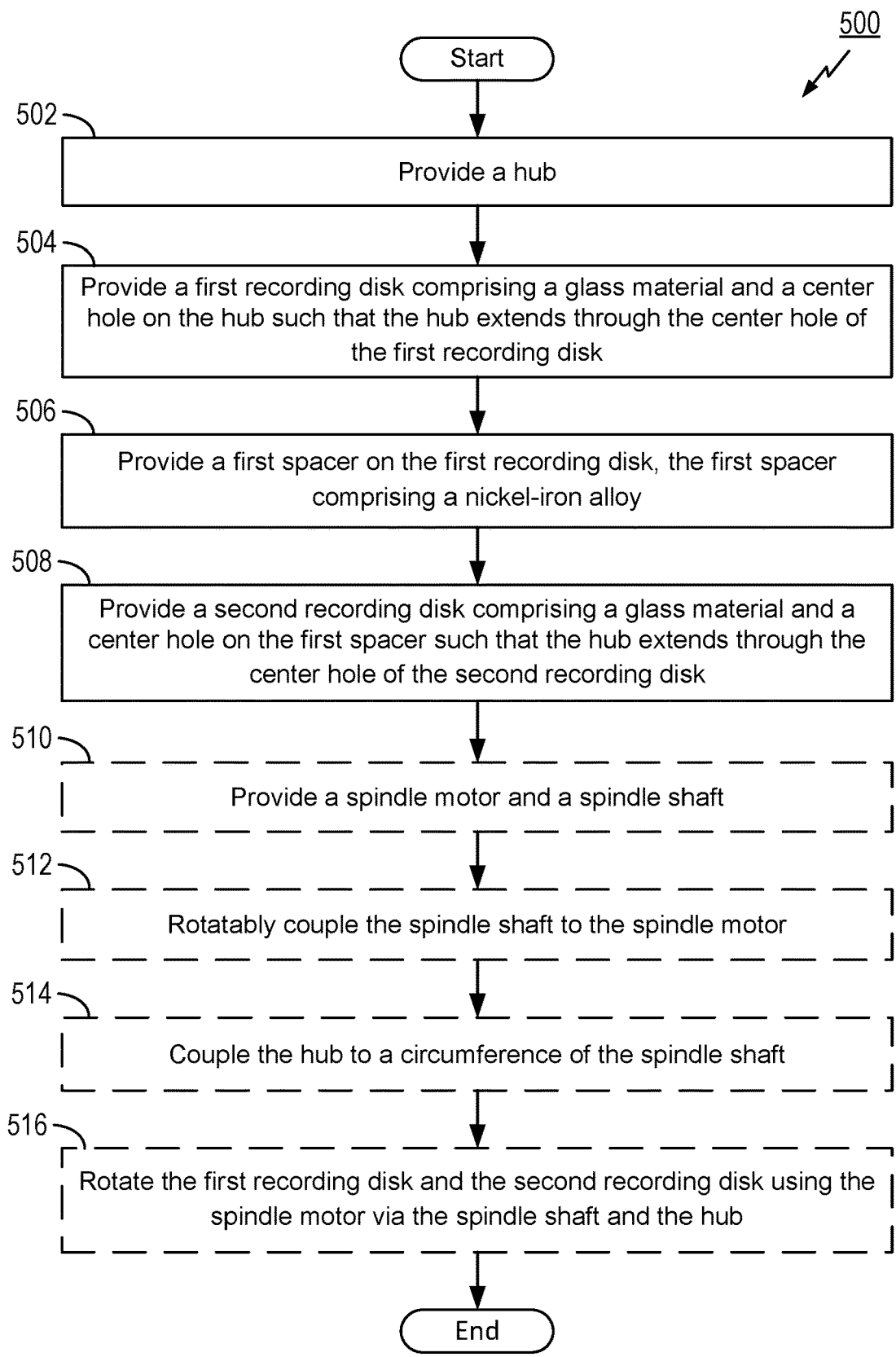
FIG. 5 illustrates a flow diagram of an exemplary method for mitigating a coefficient of thermal expansion (CTE) mismatch between glass components and adjacent metal components in a data storage device in accordance with aspects of the present disclosure.

FIG. 5 illustrates a flow diagram of an exemplary method 500 for mitigating a coefficient of thermal expansion (CTE) mismatch between glass components and adjacent metal components in a data storage device (e.g., data storage device 100 or 400) in accordance with aspects of the present disclosure.

The method 500 includes providing a hub (e.g., hub 123 or 423) as shown at block 502.

The method 500 further includes providing a first recording disk (e.g., recording disk 117-C or 417-C) comprising a glass material and a center hole on the hub such that the hub extends through the center hole of the first recording disk as shown at block 504.

The method 500 also includes providing a first spacer (e.g., spacer 124-1 or 424-1) on the first recording disk, the first spacer comprising a nickel-iron alloy as shown at block 506.

The method 500 includes providing a second recording disk (e.g., recording disk 117-B or 417-B) comprising a glass material and a center hole on the first spacer such that the hub extends through the center hole of the second recording disk as shown at block 508. In an aspect, the first recording disk and the second recording disk each comprise a magnetic recording layer configured to store information. Moreover, each recording disk may include a heat sink layer.

Optionally, the method 500 further includes providing a spindle motor (e.g., spindle motor 125 or 425) and a spindle shaft (e.g., spindle shaft 118) as shown at block 510, rotatably coupling the spindle shaft to the spindle motor as shown at block 512, coupling the hub (e.g., hub 123 or 423) to a circumference of the spindle shaft as shown at block 514, and rotating the first recording disk and the second recording disk using the spindle motor via the spindle shaft and the hub as shown at block 516.

In an aspect, the hub is made of stainless steel. Moreover, the selected nickel-iron alloy has a nickel composition within a range of 36% to 42% nickel by weight (e.g., wt %). Such nickel composition results in a CTE for the nickel-iron alloy that matches the CTE of the glass material within a preselected tolerance. In an aspect the preselected tolerance may be 20% or about 20%. In an aspect, the CTE of the nickel-iron alloy is within a range of $1.5 \times 10^{-6}$ (° C.)$^{-1}$ to $5.3 \times 10^{-6}$ (° C.)$^{-1}$, and the CTE of the glass material is within a range of $3.0 \times 10^{-6}$ (° C.)$^{-1}$ to $5.1 \times 10^{-6}$ (° C.)$^{-1}$.

In an aspect, the first spacer (e.g., spacer 424) includes two layers of the nickel-iron alloy separated by a layer of a composite polymer. For example, the composite polymer may be carbon-doped polyether-ether-ketone (PEEK). Accordingly, if the first spacer includes the layer of carbon-doped PEEK, then the hub may be made of aluminum or an aluminum alloy.

Figure 6:
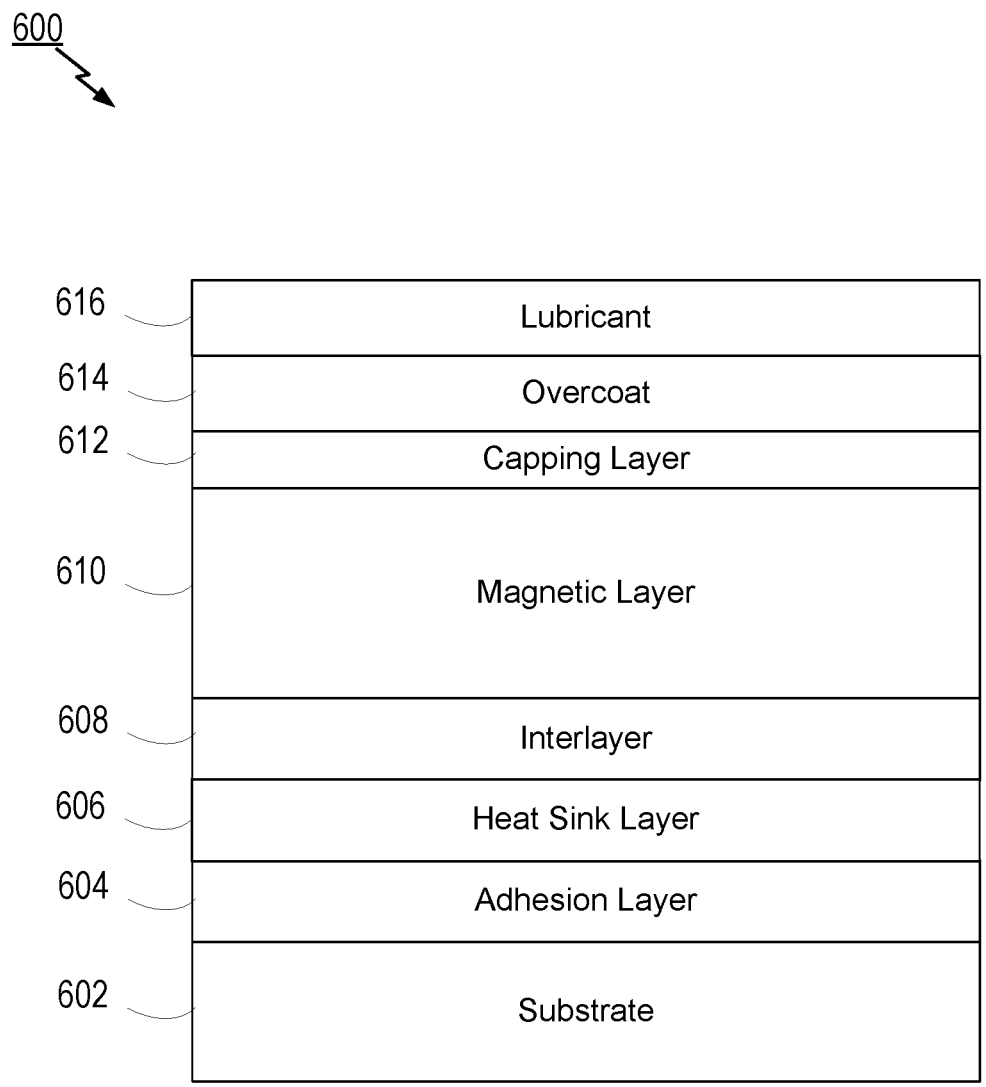
FIG. 6 is a side schematic view of a magnetic medium configured for heat assisted magnetic recording (HAMR) in accordance with an aspect of the present disclosure.

FIG. 6 is a side schematic view of a magnetic medium configured for heat assisted magnetic recording (HAMR) in accordance with an aspect of the present disclosure. In one aspect, the magnetic recording medium 600 may be used in a HAMR system (e.g., disk drive 100). The magnetic recording medium 600 has a stacked structure with a substrate 602 (e.g., a glass substrate) at a bottom/base layer, an adhesion layer 604 on the substrate 602, a heat sink layer 606 on the adhesion layer 604, an interlayer 608 on the heat sink layer 606, a magnetic recording layer (MRL) 610 on the interlayer 608, a capping layer 612 on the MRL 610, an overcoat layer 614 on the capping layer 612, and a lubricant layer 616 on the overcoat layer 614. In one aspect, the magnetic recording medium 600 may have a soft magnetic underlayer (SUL) between the adhesion layer 604 and the heat sink layer 606. In one aspect, the magnetic recording medium 600 may have a thermal resistance layer (TRL) between the interlayer 608 and the heat sink layer 606. In one aspect, the HAMR medium can have additional layers or fewer layers, depending on the application.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

It shall be appreciated by those skilled in the art in view of the present disclosure that although various exemplary methods are discussed herein with reference to treatment of glass substrates for magnetic recording disks, the methods, with or without some modifications, may be used for treatment of glass substrates for other types of recording disks, for example, optical recording disks such as a compact disc (CD) and a digital-versatile-disk (DVD), or magneto-optical recording disks, or ferroelectric data storage devices.

Various components described in this specification may be described as "including" or made of certain materials or compositions of materials. In one aspect, this can mean that the component consists of the particular material(s). In another aspect, this can mean that the component comprises the particular material(s).

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure shall mean within 10 percent of the 'value X'. For example, a value of about 1 or approximately 1, would mean a value in a range of 0.9-1.1. In the disclosure various ranges in values may be specified, described and/or claimed. It is noted that any time a range is specified, described and/or claimed in the specification and/or claim, it is meant to include the endpoints (at least in one embodiment). In another embodiment, the range may not include the endpoints of the range. In the disclosure various values (e.g., value X) may be specified, described and/or claimed. In one embodiment, it should be understood that the value X may be exactly equal to X. In one embodiment, it should be understood that the value X may be "about X," with the meaning noted above.

What is claimed is:

1. A data storage device, comprising:
a hub;
a plurality of stacked recording disks, each recording disk comprising:
    a substrate comprising a glass material and a center hole; and
    a magnetic recording layer configured to store information,
    wherein the plurality of stacked recording disks are positioned on the hub via respective center holes; and
a plurality of spacers disposed between the plurality of stacked recording disks, each spacer comprising a nickel-iron alloy.

2. The data storage device of claim 1, wherein the nickel-iron alloy has a nickel composition within a range of 36% to 42% nickel by weight.

3. The data storage device of claim 2, wherein the nickel composition results in a coefficient of thermal expansion (CTE) for the nickel-iron alloy that matches a CTE of the glass material within a preselected tolerance.

4. The data storage device of claim 3, wherein:
the CTE of the nickel-iron alloy is within a range of $1.5 \times 10^{-6}$ (° C.)$^{-1}$ to $5.3 \times 10^{-6}$ (° C.)$^{-1}$;
the CTE of the glass material is within a range of $3.0 \times 10^{-6}$ (° C.)$^{-1}$ to $5.1 \times 10^{-6}$ (° C.)$^{-1}$; and
the preselected tolerance is 20%.

5. The data storage device of claim 1, wherein at least one spacer of the plurality of spacers comprises two layers of the nickel-iron alloy separated by a layer of a composite polymer.

6. The data storage device of claim 5, wherein the composite polymer comprises carbon-doped polyether-ether-ketone (PEEK).

7. The data storage device of claim 5, wherein the hub comprises a material selected from the group consisting of aluminum, an aluminum alloy, and stainless steel.

8. The data storage device of claim 1, further comprising:
a spindle motor; and
a spindle shaft rotatably coupled to the spindle motor,
wherein the hub is coupled around a circumference of the spindle shaft and within the respective center holes of the plurality of stacked recording disks to secure each recording disk to the spindle shaft,
wherein the plurality of stacked recording disks are configured to be rotated by the spindle motor via the spindle shaft and the hub,
wherein the glass material of the substrate has a first coefficient of thermal expansion (CTE), and
wherein a nickel composition of the nickel-iron alloy results in a second CTE for the nickel-iron alloy that matches the first CTE of the glass material within a preselected tolerance.

9. The data storage device of claim 1, wherein each recording disk further comprises a heat sink layer.

10. The data storage device of claim 1, wherein the hub comprises stainless steel.

11. A method of fabricating a data storage device, comprising:
providing a hub;

providing a first recording disk comprising a glass material and a center hole on the hub such that the hub extends through the center hole of the first recording disk;

providing a first spacer on the first recording disk, the first spacer comprising a nickel-iron alloy;

providing a second recording disk comprising a glass material and a center hole on the first spacer such that the hub extends through the center hole of the second recording disk;

providing a second spacer on the second recording disk, the second spacer comprising a nickel-iron alloy;

providing a third recording disk comprising a glass material and a center hole on the second spacer such that the hub extends through the center hole of the third recording disk, wherein the first recording disk, the second recording disk, and the third recording disk, each comprise a magnetic recording layer configured to store information.

12. The method of claim 11, wherein the nickel-iron alloy of at least one of the spacers has a nickel composition within a range of 36% to 42% nickel by weight.

13. The method of claim 12, wherein the nickel composition results in a CTE for the nickel-iron alloy of at least one of the spacers that matches the CTE of the glass material of at least one of the disks within a preselected tolerance.

14. The method of claim 13, wherein:
the CTE of the nickel-iron alloy of at least one of the spacers is within a range of $1.5 \times 10^{-6}$ $(°C.)^{-1}$ to $5.3 \times 10^{-6}$ $(°C.)^{-1}$;
the CTE of the glass material of at least one of the disks is within a range of $3.0 \times 10^{-6}$ $(°C.)^{-1}$ to $5.1 \times 10^{-6}$ $(°C.)^{-1}$; and
the preselected tolerance is 20%.

15. The method of claim 11, wherein at least one of the first and second spacers comprises two layers of the nickel-iron alloy separated by a layer of a composite polymer.

16. The method of claim 15, wherein the composite polymer comprises carbon-doped polyether-ether-ketone (PEEK).

17. The method of claim 15, wherein the hub comprises a material selected from the group consisting of aluminum, an aluminum alloy, and stainless steel.

18. The method of claim 11, further comprising:
providing a spindle motor and a spindle shaft;
rotatably coupling the spindle shaft to the spindle motor;
coupling the hub to a circumference of the spindle shaft; and
rotating the first recording disk and the second recording disk using the spindle motor via the spindle shaft and the hub.

19. A data storage device, comprising:
a hub;
a plurality of stacked recording disks, each recording disk comprising:
a substrate comprising a glass material and a center hole, and
a magnetic recording layer configured to store information,
wherein the plurality of stacked recording disks comprise at least three recording disks positioned on the hub via respective center holes; and
at least one means for providing spacing between each pair of adjacent recording disks of the at least three stacked recording disks, with each of the means for providing spacing comprising a nickel-iron alloy.

20. The data storage device of claim 19:
wherein the glass material of the substrate has a first coefficient of thermal expansion (CTE); and
wherein the nickel-iron alloy has a nickel composition that results in a second CTE for the nickel-iron alloy that matches the first CTE of the glass material within a preselected tolerance.

21. A data storage device, comprising:
a hub;
a plurality of stacked recording disks, each recording disk comprising:
a substrate comprising a glass material and a center hole; and
a magnetic recording layer configured to store information,
wherein the plurality of stacked recording disks comprise at least three stacked recording disks positioned on the hub via respective center holes; and
a plurality of spacers with at least one of the spacers disposed between each pair of adjacent recording disks of the at least three stacked recording disks, each spacer comprising a nickel-iron alloy.

22. The data storage device of claim 21, wherein at least one of the plurality of spacers comprises two layers of the nickel-iron alloy separated by a layer of a composite polymer.

23. A data storage device, comprising:
a hub;
a first recording disk comprising a glass material and a center hole on the hub such that the hub extends through the center hole of the first recording disk;
a spacer on the first recording disk, the spacer comprising two layers of a nickel-iron alloy separated by a layer of a composite polymer; and
a second recording disk comprising a glass material and a center hole on the spacer such that the hub extends through the center hole of the second recording disk,
wherein the first recording disk and the second recording disk each comprise a magnetic recording layer configured to store information.

* * * * *